United States Patent [19]
Kukimoto et al.

[11] Patent Number: 5,140,385
[45] Date of Patent: Aug. 18, 1992

[54] LIGHT EMITTING ELEMENT AND METHOD OF MANUFACTURE

[75] Inventors: Hiroshi Kukimoto, Kanagawa; Iwao Mitsuishi; Takashi Yasuda, both of Tokyo, all of Japan

[73] Assignee: Misawa Co., Ltd., Tokyo, Japan

[21] Appl. No.: 639,306

[22] Filed: Jan. 4, 1991

Related U.S. Application Data

[60] Continuation of Ser. No. 338,738, Apr. 14, 1989, abandoned, which is a division of Ser. No. 173,067, Mar. 25, 1988, abandoned.

[30] Foreign Application Priority Data

| | | | |
|---|---|---|---|
| Mar. 27, 1987 | [JP] | Japan | 62-71567 |
| Sep. 25, 1987 | [JP] | Japan | 62-238655 |
| Dec. 29, 1987 | [JP] | Japan | 62-335866 |

[51] Int. Cl.$^5$ .................. H01L 33/00; H01L 29/161; H01L 29/207; H01L 29/20
[52] U.S. Cl. ......................... 357/17; 357/61; 357/63
[58] Field of Search ............... 357/17, 61, 63; 437/81, 437/127

[56] References Cited

U.S. PATENT DOCUMENTS

| | | | |
|---|---|---|---|
| 4,422,888 | 12/1983 | Statias | 148/175 |
| 4,526,632 | 7/1985 | Nishizawa | 148/171 |
| 4,619,718 | 10/1986 | Nishizawa | 148/171 |
| 4,632,711 | 12/1986 | Fujita et al. | 148/175 |
| 4,819,057 | 4/1989 | Naito et al. | 357/17 |
| 4,819,058 | 4/1989 | Nishizawa | 357/17 |
| 4,868,615 | 9/1989 | Kamata | 357/17 |
| 4,926,229 | 5/1990 | Nakagawa et al. | 357/30 |

FOREIGN PATENT DOCUMENTS

| | | | |
|---|---|---|---|
| 59-16393 | 1/1984 | Japan | 357/17 |
| 62-47175 | 2/1987 | Japan | 437/127 |

OTHER PUBLICATIONS

Halliday, Fundamentals of Physics, 1981, p. 507.

Primary Examiner—Andrew J. James
Assistant Examiner—Stephen D. Meier
Attorney, Agent, or Firm—McAulay, Fisher, Nissen, Goldberg & Kiel

[57] ABSTRACT

A light emitting element for a blue light emitting diode which consists of a semiconductor substrate crystal, a II-VI compound semiconductor layer having an n-type conduction of low resistivity and a II-VI compound semiconductor layer having a p-type conduction of low resistivity, wherein each layer is deposited from a vapor phase on the substrate crystal.

20 Claims, 2 Drawing Sheets

LIGHT EMITTING ELEMENT AND METHOD OF MANUFACTURE

This application is a continuation of application Ser. No. 07/338,738, filed Apr. 14, 1989, which in turn is a divisional of application Ser. No. 07/173,067, filed Mar. 25, 1988, now abandoned.

OBJECT OF THE INVENTION

APPLICATION FIELDS IN INDUSTRY

This invention is concerned with blue light emitting devices, such as blue light emitting diodes (LEDs) and short wavelength visible lasers, and their manufacturing technologies.

CONVENTIONAL TECHNOLOGIES

Nowadays, mass production techniques for LEDs which emit visible light from red through green have been established and visible light lasers from red through yellow are becoming in practical use. Displays which utilize these devices are also becoming important. Accordingly, increasingly there is a great need and expectation for blue LEDs, which have not been manufactured in a mass-production scale, and blue and green lasers, which have not been fabricated yet. Blue light is the only color that has not as yet been realized in a family of LEDs; and it is needed in order to produce full color displays.

The first condition required for materials for green and blue LEDs and lasers is that the band gap energy must be larger than 2.6 eV. SiC (2.6 eV), GaN (3.4 eV) and $ZnS_xSe_{1-x}$ (2.7–3.8eV) meet the condition. The other condition to manufacture highly efficient light emitting devices is that a technique should be available to fabricate good p-n junctions with a high quality light emitting layer on large diameter substrates.

However, there exists a great barrier in realizing such light emitting devices. The problems for each material are as follows. SiC which has no appropriate large diameter substrates for epitaxial growth although a pn junction can be fabricated. No p-n junctions with high efficient light emission can be made in GaN because a p-type layer has not been successfully fabricated in spite of a great effort. Furthermore, for $ZnS_xSe_{1-x}$, a p-type crystal can be grown only by means of a solution growth technique, and hence no mass production technique to grow p and n layers on a large diameter substrates with good reproducibility has been developed.

II-VI compound semiconductors such as $ZnS_xSe_{1-x}$ ($0<X<1$) have a wide band gap and are direct transition semiconductors which manifest themselves as highly efficient light emitting materials. In addition, the hetero epitaxy of II-VI materials is possible on Si, GaP and/or GaAs substrates with good lattice-constant matching by selecting the alloy composition x. Such epitaxial growth is achieved either with a Metal Organic Chemical Vapor Deposition (MOCVD) technique or Molecular Beam Epitaxial (MBE) technique. Furthermore, n-type conductivity can be controlled by doping either IIIa elements or VIIa elements in the periodic table. However, a great drawback of these materials is that p-type epitaxial layers cannot be grown by conventional techniques. Because of this fact, blue light-emitting-diodes and semiconductor lasers cannot be manufactured since for each light emitting device both n and p type layers must be grown successively.

Thus, the present inventors invented a new vapor phase epitaxy technique to grow p-type layers of $ZnS_xSe_{1-x}$ with low resistivity by doping into the p type layer with Ia elements. These Ia elements which are in the periodic table such as Lithium (Li), Sodium (Na) and Potassium (K) under the condition that a flux ratio of VIa elements to IIb elements ranges from 1 to 100 are useful for this purpose.

In order to solve the aforementioned problems, the present invention claims as a specific invention the multiple layer structures which consist of n-type II-VI semiconductor layers with a resistivity ranging from $10^{-3}$ to $10^{-3}$ Ohm-cm and p-type II-VI semiconductor layers with conductivity ranging from $10^{-3}$ to $10^3$ Ohm-cm, all of which are vapor phase epitaxially grown on semiconductor substrates by selectively changing the composition x with lattice-constant matching. This invention also claims for such that such manufacturing techniques that metalorganic gases for II elements and hydride gases for VI elements are used to continuously to grow both n- and p-type II-VI semiconductor layers on lattice matched semiconductor substrates under the condition that the flux ratio of II elements to VI elements is varied from $2\times10^{-3}$ to 10.

SUMMARY OF THE INVENTION

In summary, as mentioned above, this invention claims [1] that multiple II-VI semiconductor layer structures, which consist of n-type and p-type conductive layers, can be continuously grown by a vapor phase epitaxial technique on semiconductor substrates [2] that during the epitaxial growth, Ia elements such as Li, Na and K and their compounds are introduced to fabricate p-type $AnS_xSe_{1-x}$ conductive layers with low resistivity for instance, by choosing Zn as a IIb element and Se and S as VIa elements to form a host crystal, $ZnS_xSe_{1-x}$ on such semiconductor substrates such as Si, GaAs or GaP, [3] that buy alternative growth of p-type layers and n-type layers, pn junction blue light emitting devices are fabricated uniformly and with good reproducibility on the said large diameter semiconductor substrates for which mass production techniques have already been established, and [4] thus this invention assures a mass production technique with high yield for blue light emitting devices, with which full color solid state displays using red, green and blue light emitting devices are able to be produced in a large scale.

With this invention, since Va elements which are mentioned in the periodic table, are doped simultaneously with Ia elements, the vacancies of VI host atoms which are produced by the occupation of Ia dopants are compensated for by the doped Va elements, thereby reducing point defects and improving the quality of the crystal.

With this co-doping of Ia and Va elements, Ia elements, which in a normal condition are mobile, can form a bonding with Va elements sitting at the neighboring position in a crystal lattice and hence can be stabilized. Therefore, motion of Ia elements is suppressed, and hence stable characteristics and long life time are expected for light emitting devices manufactured by the present technique.

FIG. 1 illustrates an example of embodiments of this invention achieved by a Metal Organic Vapor Phase Epitaxial apparatus for manufacturing light emitting devices dealt with in this invention. FIG. 2 illustrates the second embodiment of this invention by an MBE apparatus. FIG. 3 illustrates a cross section of an embodiment of the structure of light emitting devices.

EXAMPLE OF EMBODIMENTS

A detailed interpretation of embodiments is given by using the figures in the following.

BRIEF DESCRIPTION OF THE DRAWINGS

Figure 1:
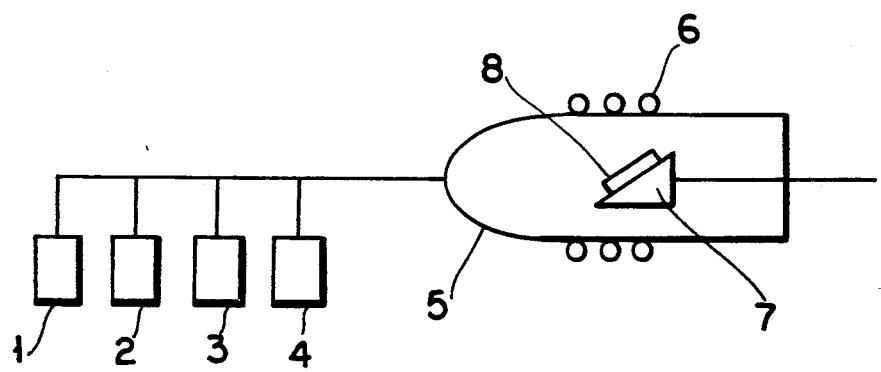
FIG. 1 illustrates the schematic diagram of metalorganic vapor phase epitaxial growth system to be used for fabricating the light-emitting devices with which this invention is concerned, where host and impurity source materials are transported from their containers (1-4) to a reactor chamber (5) and crystal growth takes place on a substrate (8) mounted on a susceptor (7) heated with an rf coil (6).

FIG. 1 illustrates an example of embodiments, an MOVPE apparatus for manufacturing light emitting devices such as blue LEDs and visible light (blue and green) lasers. I is a cylinder of IIb elements, for instance, Zn which is a source of a host atom in a II-VI semiconductor, 2 and 3 are cylinders of VIa elements such as Se and S which are sources of V elements in a host crystal. 4 is a cylinder for impurities such as Li, Na or K or their compounds. All the host atoms and impurities are selectively supplied from these cylinders to a reactor tube 5 which is made from silica. An induction heater 6 heats a graphite susceptor 7 inserted in the reactor 5 and the temperature of a semiconductor substrate 8, for instance, a GaAs wafer, which is set on the susceptor 7 is raised. The multiple layer structure which consists of, for instance, a p-type II-VI semiconductor layer 9 on an n-type II-VI semiconductor layer 10 grown on an n-type III-V semiconductor substrate 8 as shown in FIG. 3 can now be formed by a continuous vapor phase epitaxial growth. 11 and 12 in the figure are Ohmic contact electrodes.

Figure 2:
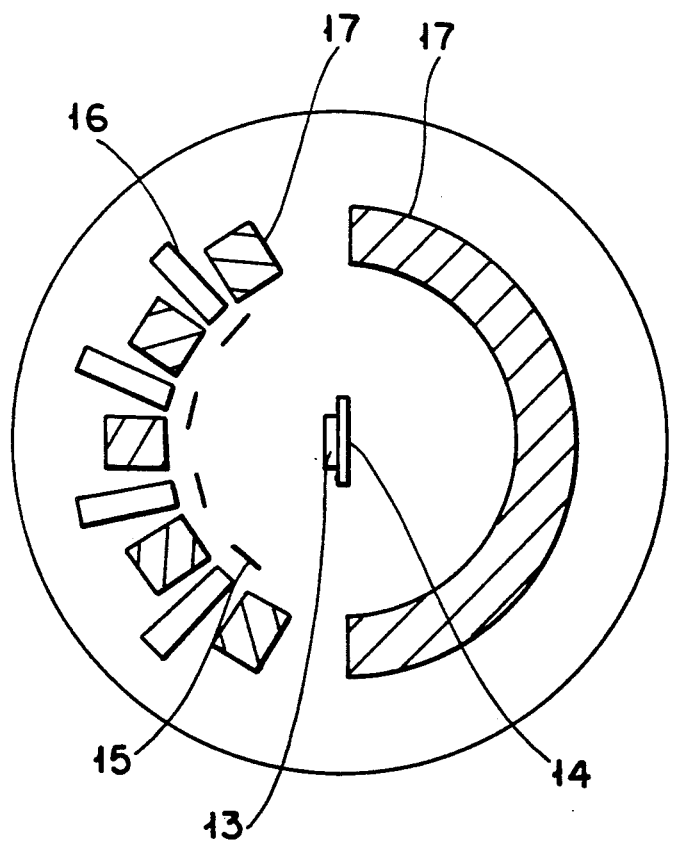
FIG. 2 illustrates the configuration of the source materials and the substance on which an epitaxial layer is to be grown by molecular beam epitaxy.

FIG. 2 illustrates another example of the embodiments, an MBE apparatus which is used to manufacture the structure claimed in the present invention. In the figure, 16 is a crucible heated by a resistive heater, 17 is a liquid nitrogen cooled shroud, and 15 is a shutter. A molybdenum beam susceptor 14 is placed in the center of the liquid nitrogen cooled shroud 17 and a semiconductor substrate 13 is set on the susceptor 14. The grown II-VI semiconductor crystal layer is formed by continuous epitaxial growth on a semiconductor substrate 13 through a shutter 15. The structure shown in FIG. 3 is formed by continuous epitaxial growth of an n-type II-VI semiconductor layer such as an n-type $ZnS_xSe_{1-x}$ (x=0.08) 10 or ZnSe is grown on the said substrate 8. 9 is a p-type $ZnS_xSe_{1-x}$ or ZnSe. To form the said p-type $ZnS_xSe_{1-x}$, Ia elements such as Li and Va elements such as N are simultaneously doped. A pn junction is formed between the said p-type layer 9 and the n-type layer 10. 12 is an Ohmic contact for the n-type material and 11 is an Ohmic contact for the p-type material.

Figure 3:
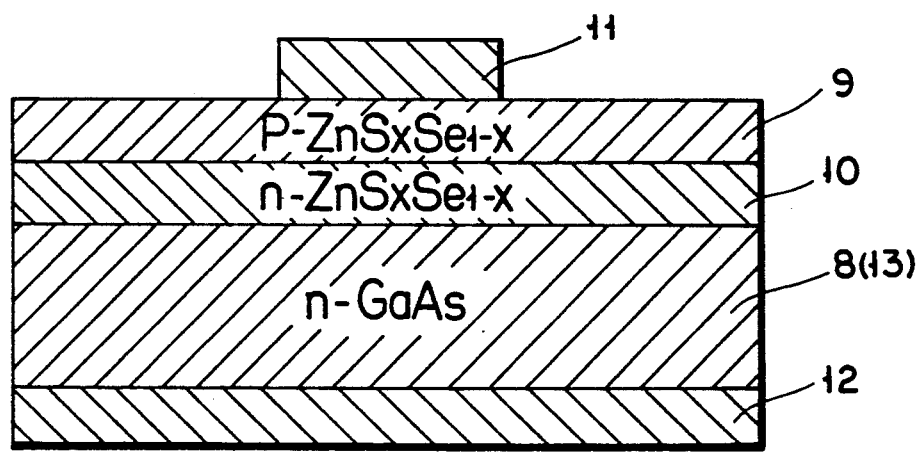
FIG. 3 illustrates a cross-section of one of the lightemitting diodes with which this invention is concerned. This diode consists of a p-type $ZnS_xSe_{1-x}$ layer (9), an n-type $ZnS_xSe_{1-x}$ layer (10) and an n-type GaAs substrate (8). Ohmic electrodes (11,12) were made on both sides of the surfaces.

In an LED structure shown in the FIG. 3, since Va elements such as N are doped as well as Ia elements, lattice defects can be reduced as compared with the case where only Ia element is doped as an acceptor to realize a p-type conductivity. So far it is said that Se vacancies are produced by Ia elements such as Li which forms bonding with the II elements such as Zn in a lattice.

Contrary to the above fact, the co-doping of Va elements such as N with Ia elements during vapor phase epitaxy suppresses the generation of point defects, since Se-vacancies are replaced with doped Va elements such as N. Thus, a p-type crystal film can be vapor phase epitaxially grown with very low concentration of point defects even under a high impurity concentration.

With this doping of Li and N, Li which is mobile in a normal condition, can form a bonding with N at the neighboring position in a crystal lattice and hence becomes immobile. Therefore, motion of Li is suppressed, and stable characteristics and long life time of light emitting devices are expected. The n-type epitaxial layer 1? and the p-type epitaxial layer 9 can be formed by continuous epitaxial growth using either the MOVPE apparatus or the MBE apparatus.

This invention is not limited to the aforementioned cases but is also extended to other cases; for instance, in the p-type $ZnS_xSe_{1-x}$ layer 9, Na and K can be used in place of Li as an acceptor and Phosphorous (P) and Arsenic (As) can be used in place of N.

In addition, in FIG. 3 the substrate 8 is n-type GaAs but p-type GaAs can be used, too. In this case, a p-type layer is first grown on the p-type substrate and then an n-type layer is grown on the top to form a blue light emitting device, which has a similar characteristics as that shown in the figure.

In the examples of embodiments described here, the alloy composition x in the $ZnS_xSe_{1-x}$ is chosen to be 0.08 in order to match the lattice constants and then the emitted light is blue and the quantum efficiency is increased by a factor of 2. However, the composition x can be varied according to the desired color, i.e., the light wavelength, and the most appropriate substrate can be chosen so that the lattice constants match to each other. In that case x should be $0<x<1$.

EXAMPLE 1

Diethylzinc (DEZn), diethylselenide (DESe) and lithium nitride ($Li_3N$) were used as source materials for growing a p-type ZnSe layer. These materials in vapor phase were transported to a reactor chamber (5) as shown in FIG. 1 with hydrogen carrier gas. At the transport rates of $1 \times 10^{-5}$ mole/min for DEZn, $2 \times 10^{-4}$ mole/min for DESe and $3 \times 10^{-9}$ mole/min for $Li_3N$, a 1 μm-thick p-type ZnSe layer with a carrier concentration of $8.8 \times 10^{17} cm^{-3}$ and a resistivity of 0.19 Ω cm was grown epitaxially on a GaAs substrate (8) mounted on a graphite susceptor (7) heated at 450° C.

EXAMPLE 2

Diethylzinc (DEZn), diethylselenide (DESe), diethylsulphide (DES) and lithium nitride ($Li_3N$) were used as source materials for growing a p-type $ZnS_xSe_{1-x}$ ($x \approx 0.08$) layer. The growth was carried out in the same system as used in Example 1. At the transport rates of $1 \times 10^{-5}$ mole/min for DEZn, $2 \times 10^{-4}$ mole/min for DESe, $5 \times 10^{-3}$ mole/min, a 1 μm-thick p-type $ZnS_xSe_{1-x}$ ($x \approx 0.08$) layer with a carrier concentration of $5.9 \times 10^{16}$ cm$^{-3}$ and and a resistivity of 0.5 Ω cm was grown epitaxially on a GaAs substrate at 450° C.

EXAMPLE 3

A p-type $ZnS_xSe_{1-x}$ ($x \approx 0.08$) with a carrier concentration of $4.5 \times 10^{16}$ cm$^{-3}$ and a resistivity of 0.8 Ω cm was grown on a GaAs substrate at 300° C. by molecular beam epitaxy. Configuration of source materials, Zn, S, Se and Li$_3$N in the growth chamber is schematically shown in FIG. 2. Source temperature of Zn, S, Se and Li$_3$N were kept at 300° C., 310° C., 200° C. and 470° C., respectively, during growth.

EXAMPLE 4

A blue light-emitting diode with an emission peak at 467nm and an external quantum efficiency of 0.8% was fabricated by metalorganic chemical vapor deposition. The diode consisted of an n-type ZnSe layer with carrier concentration of $5 \times 10^{17}$ cm$^{-3}$ and a p-type ZnSe layer with carrier concentration of $1 \times 10^{17}$ cm$^{-3}$. The n- and p-type layers were sequentially grown on a p-type GaAs substrate. Dimethylzinc (DMZn) and diethylselenide (DESe) were used as source materials. Trimethylalluminum (TEAl), and Li$_3$N were used as n- and p-type dopant sources, respectively. Typical transport rates of DMZn, DESe, TEAl and Li$_3$N were $1 \times 10^{-5}$ mole/min, $2 \times 10^{-4}$ mole/min, $1 \times 10^{-8}$ mole/min and $3 \times 10^{-8}$ mole/min, respectively. The growth temperature was 450° C.

EXAMPLE 5

A ZnSe blue light-emitting diode of the same structure as described in Example 4 was also fabricated by molecular beam epitaxy at 300° C. with the use of source materials of Zn, Se, Al (n-type dopant) and Li$_3$N (p-type dopant). The external quantum efficiency was 0.2%. The peak wavelength of emission band was located at 467 nm.

What is claimed is:

1. A light emitting diode comprising:
   a semiconductor substrate crystal and a II-VI compound with a p-type condition semiconductor layer having a resistivity of $10^{-3}$ to $10^3$ Ω cm and said layer consisting of impurities of group Ia elements and a sub-group of group V elements deposited from a vapor phase on said substrate crystal to provide for codoping with acceptor impurities of group I and group V elements.

2. The diode of claim 1, wherein the group Ia elements are selected from the group consisting of lithium, sodium and potassium.

3. The diode of claim 2, wherein the sub-group V elements are selected from the sub-group Va elements of the group V consisting of nitrogen, phosphorous and arsenic.

4. The diode of claim 1, wherein the group V elements are selected from the group consisting of nitrogen, phosphorous and arsenic.

5. The diode of claim 1, wherein the Ia elements and their compounds are introduced for fabricating p-type $ZnS_xSe_{1-x}$ conductive layers and wherein X is greater than zero and less than 1 ($0 < X < 1$).

6. The diode of claim 1, wherein p-type and n-type layers are alternatively grown to fabricate p-type layers $ZnS_xSe_{1-x}$ ($0 < X < 1$).

7. The diode of claim 1, wherein the diode has a body constructed of group IIb elements consisting of zinc (Zn) and group VI elements consisting of selenium (Se) and sulfur (S) and the group Ia elements introduced as impurities consist of lithium (Li), sodium (Na), or potassium (K).

8. An element for a light emitting diode, comprising:
   layers of a vapor phase growth of a II-VI compound semiconductor crystal having (p) type conduction of low resistivity on a semiconductor substrate;
   acceptor impurities of group Ia elements and their compounds, said impurities being introduced into the growth step, under the condition that the flux ratio of group VIa elements to group IIb elements ranges from 1 to 100 for constructing a basic body of said II-VI compound semiconductor crystal; and
   acceptor impurities of group V elements which are co-doped with the acceptor impurities of the group Ia elements.

9. The element as claimed in claim 8, wherein the body is constructed of the group IIb elements consisting of zinc (Zn) and group VI elements consisting of selenium (Se) and sulfur (S) and the group Ia elements introduced as impurities consisting of lithium (Li), sodium (Na), or potassium (K).

10. The element as claimed in claim 8, wherein the Ia elements and their compounds are introduced for fabricating p-type $ZnS_xSe_{1-x}$ conductive layers and wherein X is greater than zero and less than 1 ($0 < X < 1$).

11. The element as claimed in claim 8, including an n-type layer and a host crystal formed on a semiconductor substrate selected from the group consisting of Si, GaAs and GaP.

12. The element as claimed in claim 11, wherein p-type and n-type layers are alternatively grown to fabricate p-type layers $ZnS_xSe_{1-x}$ ($0 < X < 1$).

13. The element as claimed in claim 8, wherein vacancies of the VI host atoms produced by the group Ia dopants are compensated by doped group Va of the group V elements, to reduce point defects and improve the quality of the crystal forming the light emitting diode by the doping of the group Ia elements includes the simultaneous doping of the Va elements; and wherein the group Va elements are selected from the group consisting of nitrogen (N), phosphorous (P) and arsenic (As).

14. The element as claimed in claim 8, wherein a multi-layer structure consisting of a p-type II-VI semiconductor layer is formed on an n-type II-VI semiconductor layer grown on an n-type III-VI semiconductor substrate which is formed by a continuous vapor phase epitaxial growth, and the II-VI compound semiconductor layer contains acceptors of the group Ia elements and group Va elements.

15. The element as claimed in claim 8, wherein an n-type II-VI semiconductor layer AnSe and a p-type semiconductor layer AnSe are continuously grown on a GaAs substrate.

16. The element as claimed in claim 8 for use in a blue light emitting diode, comprising:
   a continuously grown II-VI compound semiconductor layers of (n) type conduction and II-VI compound semiconductor layers of (p) type conduction of low resistivity from the vapor phase on the semiconductor substrate crystal having the same lattice constant; and
   the flux ratio of group II elements to group VI elements being controlled and varied within a range of $2 \times 10^{-3}$ to 10 by using an organometallic gas for the group II elements and an hydride gas for the group VI elements.

17. The element as claimed in claim 16 for a blue light emitting diode, wherein:
   said impurities of group Ia elements and their compounds are introduced during the vapor phase growth;
   said group II elements comprising group IIb elements and group VI elements including sulphur (S) and selenium (Se) are used for constructing the basic body of said element;
   the p-type layers of $ZnS_xSe_{1-x}$ multiple layer structures are epitaxially grown during the vapor phase and consist of n-type II-VI semiconductor layers having a specific resistivity ranging from $10^{-3}$ to $10^3$ $\Omega$ cm by selectively changing the composition x with lattice-constant matching; and
   the p-type layers of $ZnS_xSe_{1-x}$ are doped with Ia elements including lithium (Li), sodium (Na) and potassium (K).

18. A blue light emitting diode provided with a multilayer construction consisting of a first layer of a semiconductor substrate crystal, (n) type II-VI compound semiconductor layers having a specific resistivity of $10^{-3}$ to $10^3$ $\Omega$ cm, and a second layer of (p) type II-VI compound semiconductor layers having a specific resistivity of $10^{-3}$ to $10^3$ $\Omega$ cm, said layers having different alloy compositions selectively determined to match the lattice constants to each other and said layers being grown from a vapor phase on said semiconductor substrate crystal to provide for co-doping with acceptor impurities of group I and group V elements.

19. The blue light emitting diode according to claim 18, wherein said substrate crystal is a (n) GaAs, the first layer of said II-VI compound semiconductor layers is an (n) type ZnSe, and the second layer of II-VI compound semiconductor layer is a (p) type ZnSe, and said layers are grown from said vapor phase on said substrate crystal, and said II-VI compound semiconductor layer contains acceptors of group Ia elements of the group I elements and group Va elements of the group V elements.

20. The blue light emitting diode according to claim 18, wherein said substrate crystal is a (p) type GaAs, the first layer of the II-VI compound semiconductors is a (p) type ZnSe, and the second layer of the II-VI compound semiconductor is an (n) type ZnSe, and said layers are grown from said vapor phase on said substrate crystal, and said II-VI compound semiconductor layer contains acceptors of group Ia elements of the group I elements and group Va elements of the group V elements.

* * * * *